(12) United States Patent
Zanchi et al.

(10) Patent No.: US 9,887,014 B2
(45) Date of Patent: Feb. 6, 2018

(54) RADIATION TOLERANT CIRCUIT FOR MINIMIZING THE DEPENDENCE OF A PRECISION VOLTAGE REFERENCE FROM GROUND BOUNCE AND SIGNAL GLITCH

(75) Inventors: Alfio Zanchi, Colorado Springs, CO (US); Shinichi Hisano, Colorado Springs, CO (US)

(73) Assignee: Aeroflex Colorado Springs Inc., Colorado Springs, CO (US)

( * ) Notice: Subject to any disclaimer, the term of this patent is extended or adjusted under 35 U.S.C. 154(b) by 322 days.

(21) Appl. No.: 12/642,177

(22) Filed: Dec. 18, 2009

(65) Prior Publication Data

US 2011/0148388 A1    Jun. 23, 2011

(51) Int. Cl.
*H02M 3/158* (2006.01)
*G11C 27/02* (2006.01)

(52) U.S. Cl.
CPC .......... *G11C 27/024* (2013.01); *G11C 27/026* (2013.01); *H02M 3/158* (2013.01)

(58) Field of Classification Search
USPC ................................. 323/273–274, 282–284
See application file for complete search history.

(56) References Cited

U.S. PATENT DOCUMENTS

| | | | |
|---|---|---|---|
| 4,467,407 A * | 8/1984 | Asano et al. | 363/43 |
| 5,329,224 A * | 7/1994 | Lai | 323/270 |
| 5,825,321 A | 10/1998 | Park | |
| 6,046,577 A | 4/2000 | Rincon-Mora et al. | |
| 6,465,994 B1 | 10/2002 | Xi | |
| 6,677,735 B2 | 1/2004 | Xi | |
| 6,826,390 B1 * | 11/2004 | Tamura | H03F 3/45183 375/346 |
| 6,859,157 B1 | 2/2005 | Gunther | |
| 6,930,622 B2 | 8/2005 | Brede et al. | |
| 6,972,703 B1 | 12/2005 | Yen et al. | |
| 7,095,356 B1 | 8/2006 | Pentakota et al. | |
| 7,151,472 B2 | 12/2006 | Huang et al. | |
| 7,327,166 B2 * | 2/2008 | Zanchi et al. | 326/85 |
| 7,456,619 B2 | 11/2008 | Sasaki et al. | |
| 7,847,530 B2 | 12/2010 | Takagi | |
| 8,008,975 B1 * | 8/2011 | Allen et al. | 330/297 |
| 2003/0174524 A1 * | 9/2003 | Botker et al. | 363/60 |
| 2007/0182399 A1 | 8/2007 | Enjalbert | |

(Continued)

OTHER PUBLICATIONS

Ahmed M. A. Ali et al., "A 14-bit 125 MS/s IF/RF Sampling Pipelined ADC With 100 dB SFDR and 50 fs Jitter," IEEE Journal of Solid-State Circuits, Aug. 2006, pp. 1846-1855, vol. 41, No. 8.

(Continued)

*Primary Examiner* — Jeffrey Gblende
(74) *Attorney, Agent, or Firm* — Hogan Lovells US LLP

(57) ABSTRACT

A radiation-hardened reference circuit includes a precision voltage reference circuit for generating a current-controlling voltage at first and second terminals, a driver circuit for receiving the current-controlling voltage at first and second terminals and for generating an output reference voltage, and a differential sampling circuit having first and second input terminals coupled to the first and second terminals of the voltage reference circuit, and first and second output terminals coupled to the first and second terminals of the driver circuit.

23 Claims, 6 Drawing Sheets

(56) References Cited

U.S. PATENT DOCUMENTS

| | | | |
|---|---|---|---|
| 2007/0210805 A1* | 9/2007 | Kawamura | G01R 31/44 324/541 |
| 2008/0259663 A1* | 10/2008 | Perkinson | 363/126 |
| 2009/0045679 A1* | 2/2009 | Kuzmenka | G11C 5/147 307/48 |
| 2009/0072800 A1* | 3/2009 | Ramadass et al. | 323/271 |
| 2009/0121912 A1 | 5/2009 | Zanchi et al. | |
| 2009/0224737 A1 | 9/2009 | Lou | |
| 2010/0066320 A1 | 3/2010 | Dasgupta et al. | |
| 2010/0073072 A1* | 3/2010 | Ullen et al. | 327/530 |

OTHER PUBLICATIONS

Alfio Zanchi et al., "A 16-bit 65-MS/s 3.3-V Pipeline ADC Core in SiGe BiCMOS With 78-dB SNR and 180-fs Jitter," IEEE Journal of Solid-State Circuits, Jun. 2005, pp. 1225-1237, vol. 40, No. 6.

Ram Sadhwani et al., "Adaptive CMOS Predistortion Linearizer for Fiber-Optic Links," IEEE Journal of LightwaveTechnology, Dec. 2003, pp. 3180-3193, vol. 21, No. 12.

Barrie Gilbert, "A Precise Four-Quadrant Multiplier with Subnanosecond Response," IEEE Journal of Solid-State Circuits, Dec. 1968, pp. 365-373, vol. SC-3, No. 4.

Barrie Gilbert, "A High-Performance Monolithic Multiplier Using Active Feedback," IEEE Journal of Solid-State Circuits, Dec. 1974, pp. 364-373, vol. SC-9, No. 6.

Evert Seevinck et al., "A Versatile CMOS Linear Transconductor/Square-Law Function Circuit," IEEE Journal of Solid-State Circuits, Jun. 1987, pp. 366-377, vol. SC-22, No. 3.

\* cited by examiner

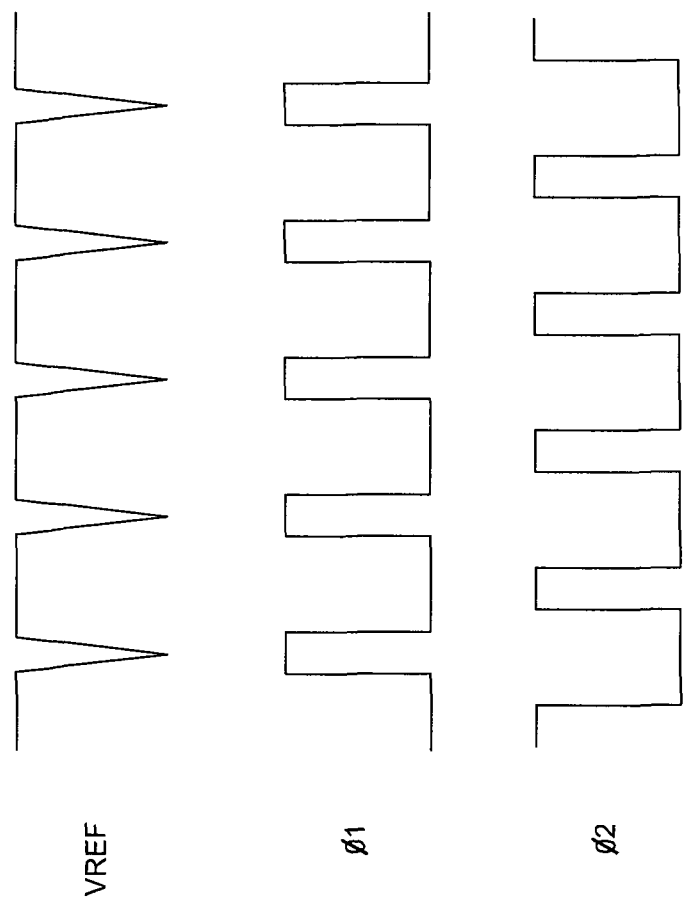

RADIATION TOLERANT CIRCUIT FOR MINIMIZING THE DEPENDENCE OF A PRECISION VOLTAGE REFERENCE FROM GROUND BOUNCE AND SIGNAL GLITCH

FIELD OF THE INVENTION

The present invention is related to voltage reference circuits and in particular to reducing noise and drift in voltage reference circuits that are used in switched-capacitor pipeline or SAR ADCs.

BACKGROUND OF THE INVENTION

Analog-to-digital conversion algorithms implemented in silicon (successive approximation registers or SARs, switched-capacitor and switched-current pipelines, folding, flash, etc.) inherently rely on the precision, accuracy, stability, and low noise of some internal reference voltage signal against which the input signals must be weighted. In particular, switched-capacitor implementations draw current out of the reference lines to charge/discharge the capacitors employed for processing the signal (in each stage's Multiplicative Digital-to-Analog Converter, or MDAC), usually perturbing the reference signal more than in switched-current implementations. For instance, the flash sub-ADC found in the first stage of a switched-capacitor pipeline conversion chain measures the signal against a resistor (or capacitor) ladder, setting the comparator thresholds. Consequently, any error and/or noise affecting the voltage references directly impacts the performance of the whole ADC, without any possibility left for correction unless some form of time-consuming and background calibration is employed.

One prior art circuit solution to the problem of $V_{ref}$ modulation from MDAC capacitors in a switched-capacitor pipelined ADC is shown in FIG. 1. Essentially, the solution is to attenuate the charge injection of the DACs that couples into the rectifying, very low-speed high-precision $V_{ref}$ regulation loop. Circuit 100 includes an amplifier 102 having a positive input for receiving the $V_{IN}$ input voltage, a negative input, and an output. The regulation loop 104 includes a triple-Darlington transistor circuit including bipolar transistors Q1, Q2, and Q3 coupled to corresponding resistors R1, R2, and R3. The loop is stabilized as is known in the art with compensation capacitor $C_{LOOP}$. The circuit "driver", 106 comprising transistors Q4, Q5, and Q6 coupled to corresponding resistors R4, R5, and R6, is a scaled replica of the triple- (or more in general, multiple-) Darlington connection of transistors Q1 through Q3 and resistors R1 through R3 found inside the regulation loop. Thus, by way of example, transistors Q3 and Q6 maintain the same relative current and voltage bias conditions such that a precisely regulated voltage is produced at the emitter of transistor Q3 and replicated at the emitter of transistor Q6 ($V_{REF}$).

The series of instantaneous charge packets drawn by the switched-capacitors within the MDAC circuitry 108 (MDAC in the case of an ADC) causes the $V_{ref}$ node to be affected in turn by a series of voltage pulses, which is not directly coupled into the loop. The pulses are attenuated by the gain of the replicated circuitry as represented by Q4 before being introduced back into the loop. At high frequency, the attenuation can be modeled by a capacitive ratio approximately equal to $C\pi/C_{LOOP}$ as determined by charge-sharing. The addition of further decoupling stages, such as followers, to both the replica and driver circuits increases the attenuation. The solution shown in FIG. 1 prevents the pulse train coming from the $V_{ref}$ output to be injected at full strength into the slow, precision loop 104 used to regulate $V_{ref}$. The envelope of the pulse train (known to be modulated by the input signal of the ADC) could in fact be sensed by the slow reaction of the loop, and possibly be rectified and/or distorted by the intrinsic non-linearity of the devices in the loop. This would have the undesirable result of transforming a slow envelope modulation of the pulse train into a slow DC modulation of the $V_{ref}$ itself.

A second prior art circuit solution is shown in FIG. 2 that does not attenuate, but rather attempts to eliminate the voltage modulation inside the $V_{ref}$ loop. This is accomplished by coupling to a capacitor the voltage synthesized by the loop to produce the desired $V_{ref}$ at the circuit driver's output, and disconnecting the loop during the occurrence of the pulses on the MDAC. Thus, there are instants at which the capacitor alone drives the output buffer, whose gate is held to the correct voltage level by the capacitor. This solution is shown in circuit 200 of FIG. 2. Circuit 200 includes the well known linear regulator circuit 204 including an amplifier 202, transistor M1, resistor R1, and compensation capacitor $C_{LOOP}$. The source of transistor M1, node 214, is designated $V_{REF\_LOOP}$. In addition, circuit 200 includes a replica driver stage 206 including transistor M2, resistor R2, and capacitor $C_{ISO}$ for providing the VREF reference voltage to MDAC 208. The replica driver stage is coupled to the voltage regulator 204 through switch 216. A switch driver circuit 210 receives an input clock signal from inverter 212, and provides the synchronization signal to both switch 216, as well as to switching circuitry in MDAC 208. Circuit 200, in operation, decouples the sensitive loop in regulator 204 from the pulse train affecting the replica driver immediately before a pulse occurs, and reconnects the replica driver immediately after such pulse during the quiet phase of the MDAC cycle. The method of operation of circuit 200 substantially eliminates the undesirable $V_{ref}$ modulation of the ADC input signal.

However, the solution provided by circuit 200 of FIG. 2 presumes precise voltage matching between the regulator and replicated driver circuit. A portion of the regulator and a portion of the replicated driver circuit are shown as circuit 300 in FIG. 3. The regulator includes transistor M1, resistor R, and capacitor $C_{LOOP}$, and is coupled to ground voltage VGND. The voltage at the gate of transistor M1 is $V_{LOOP}$. The driver circuit includes transistor M2 (a factor of m larger than M1), resistor R/m, and capacitor $C_{ISO}$, and is coupled to ground voltage $V_{GND}'$. The regulator circuit and the driver circuit are coupled through switch 316. The potential at the gate of transistor M1 is $V_{loop}=V_{GS}+R*I+V_{GND}$. For this voltage to produce the desired, precise effect in the replicated driver circuit, it is presumed to be matched by identical, or scaled, electrical quantities. However, the separate connection of the two ground voltages $V_{GND}$ and $V_{GND}'$ forces a different reference voltage to be produced in the replica driver circuit. The voltage across capacitor $C_{LOOP}$ is equal to $V_{GS}+R*I$. The voltage imparted across capacitor $C_{ISO}$ is equal to $V_{GS}'+R/m*m*I'=V_{GS}'+R*I'$, identical to the former under ideal conditions. However, in presence of any DC differences due to ohmic drop, or transient thermal drift, or any other long-term differentiation between the ground voltage of the precision loop and reference driver $V_{GND}$, versus the ground voltage of the replicated driver $V_{GND}'$, the replicated reference voltage (and current) will be in error. It is apparent that the voltage $V_{GS}'+R*I'$ will differ from the original $V_{GS}+R*I$ by an amount $\Delta V=V_{GND}-V_{GND}'$. On the other hand, it is not desirable to tie $V_{GND}$ to $V_{GND}'$, as this would modulate the $V_{ref}$ of the precision loop thus defeating the purpose of circuit 200. Device sizes W, M*W, current M*I, and replica voltage VREF' are also shown in FIG. 3.

What is desired is a reference circuit that can provide a precision isolated reference voltage, but that is radiation tolerant and does not have the ground errors present in the prior art.

SUMMARY OF THE INVENTION

According to the present invention, a radiation-hardened reference circuit includes a precision reference circuit for generating a current-controlling voltage at first and second terminals, a buffer circuit for receiving the current-controlling voltage at first and second terminals and for generating a reference voltage, and a flying capacitor circuit having first and second input terminals coupled to the first and second terminals of the precision reference circuit, and first and second output terminals coupled to the first and second terminals of the buffer circuit. The precision reference circuit includes an amplifier having a first input for receiving an input voltage, a second input, and an output, a transistor having a gate coupled to the output of the amplifier, and a current path, and a resistor coupled to the current path of the transistor and to the second input of the amplifier. The current-controlling voltage is the gate-to-source voltage of a transistor in the precision reference circuit. The precision reference circuit further includes a compensation capacitor. The flying capacitor circuit includes a first pair of switches coupled to first and second input terminals, a second pair of switches coupled to first and second output terminals, and a capacitor coupled between the first and second pair of switches. The first pair of switches is controlled by a first clock signal, and the second pair of switches is controlled by a second clock signal. The first clock signal and the second clock signal are generated from a common clock signal and are non-overlapping. The buffer circuit includes a transistor for receiving the gate-to-source voltage of the transistor in the precision reference circuit. The buffer circuit is coupled to the first output terminal of the flying capacitor circuit, and a resistor coupled to a current path of the transistor and to the second output terminal of the flying capacitor circuit. The buffer circuit can optionally include an isolation capacitor. While the precision reference circuit is referenced to a first ground potential and the buffer amplifier is referenced to a second ground potential, the performance of the reference circuit of the present invention is substantially unaffected by this difference in ground voltages.

BRIEF DESCRIPTION OF THE DRAWINGS

The present invention is illustrated by way of example and not limitation in the accompanying figures in which like reference numerals indicate similar elements and in which:

FIG. 6 is a timing diagram associated with the reference circuit shown in FIG. 4.

DETAILED DESCRIPTION OF THE INVENTION

It is thus desirable to impart the wanted driving signal $V_{REF}=V_{REF\_LOOP}$ onto the MDACs of the ADC, without it being affected by any error existing between $V_{GND}$ and $V_{GND'}$. This can be achieved by relying on the identity (or precision scaling) of the $V_{GS}$ of the follower's MOSFET and of the degeneration resistor, which were expected, and capitalized upon, also in prior art. In such case in fact, the $V_{REF}$ driver can be referenced to the precision loop by way of a floating (i.e., ground-independent) capacitor connected directly across the gate and source nodes of the active device, as illustrated in FIG. 4.

Figure 1:
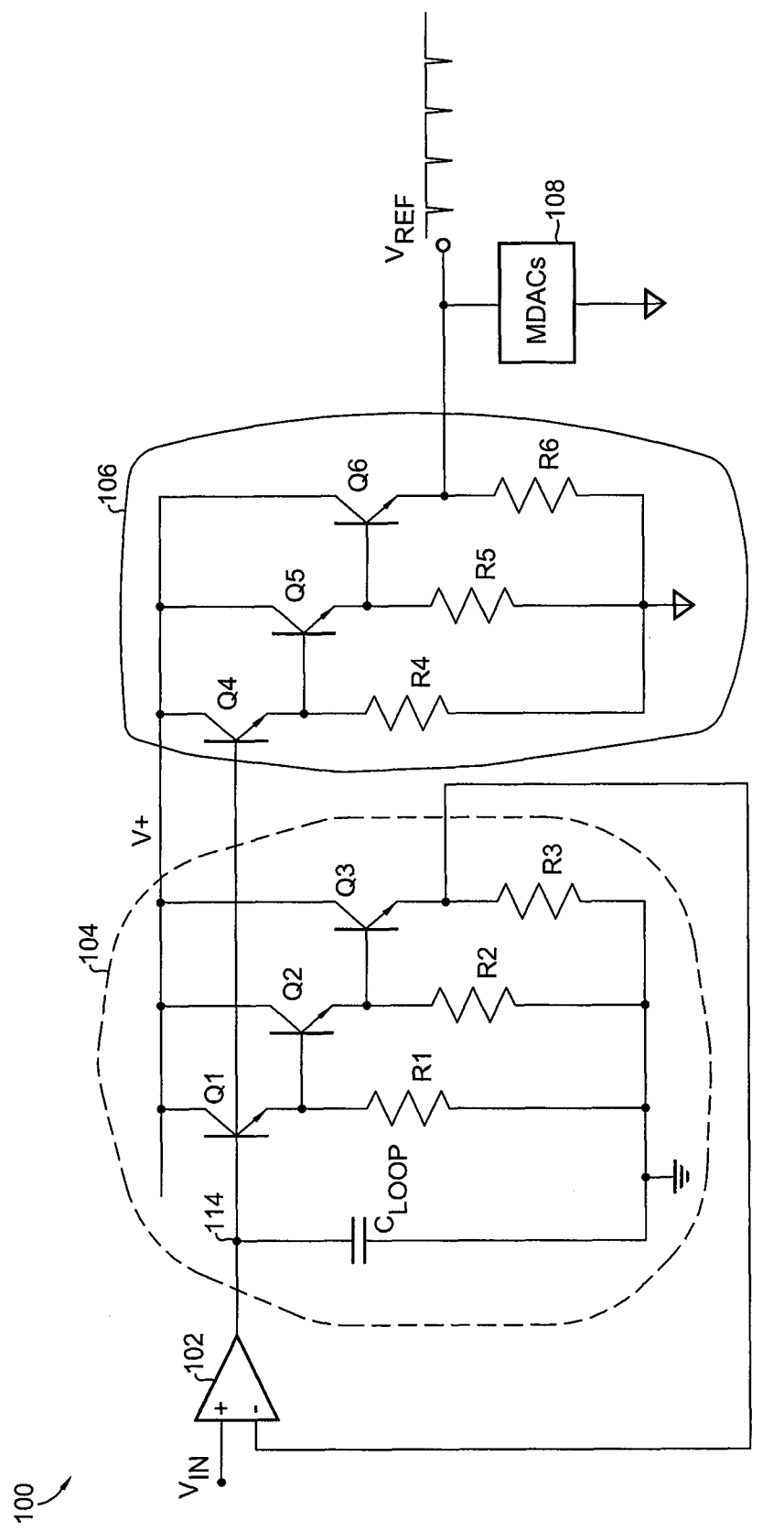
FIG. 1 is a schematic diagram of a first reference circuit according to the prior art.
Figure 2:
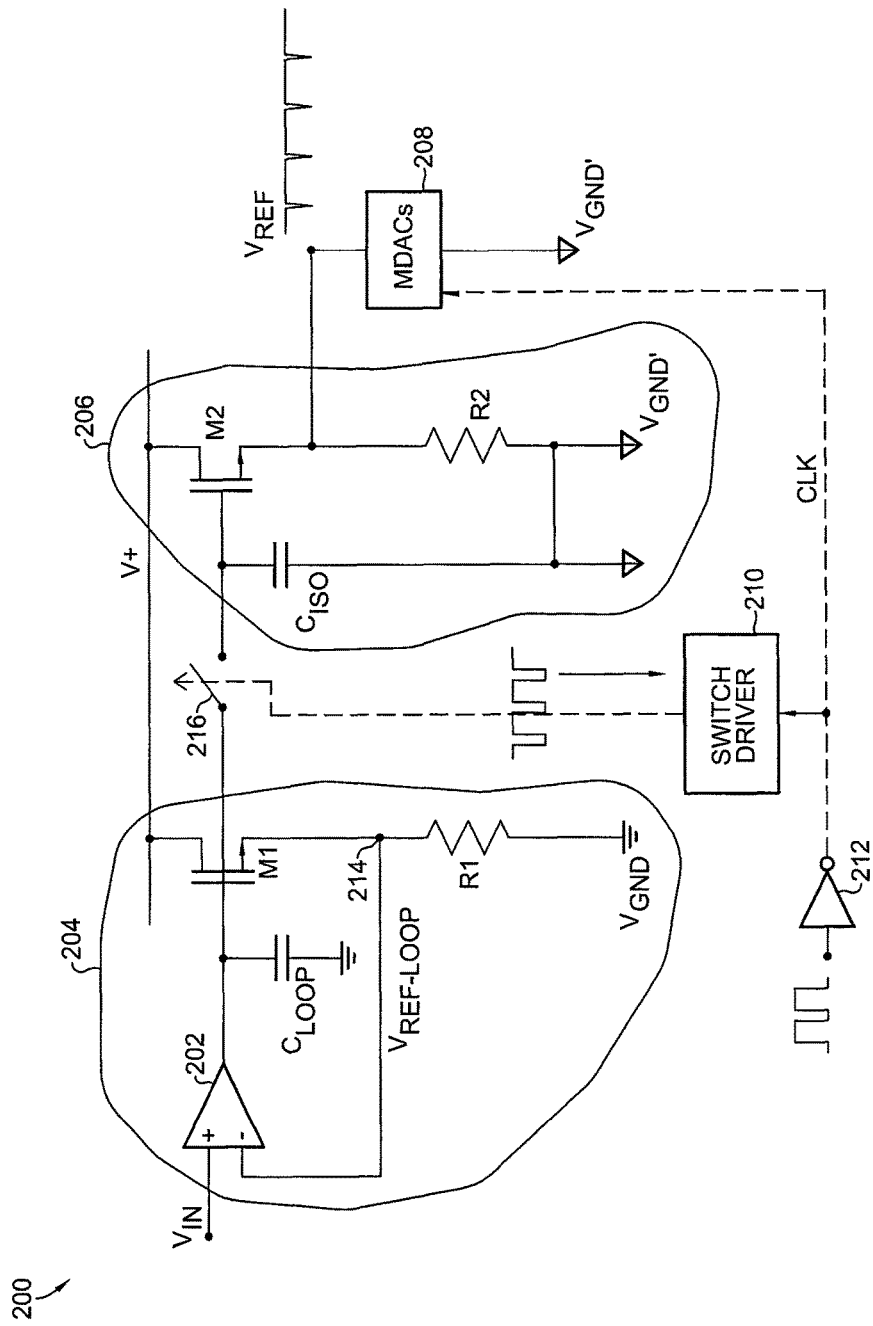
FIG. 2 is a schematic diagram of a second reference circuit according to the prior art.
Figure 3:
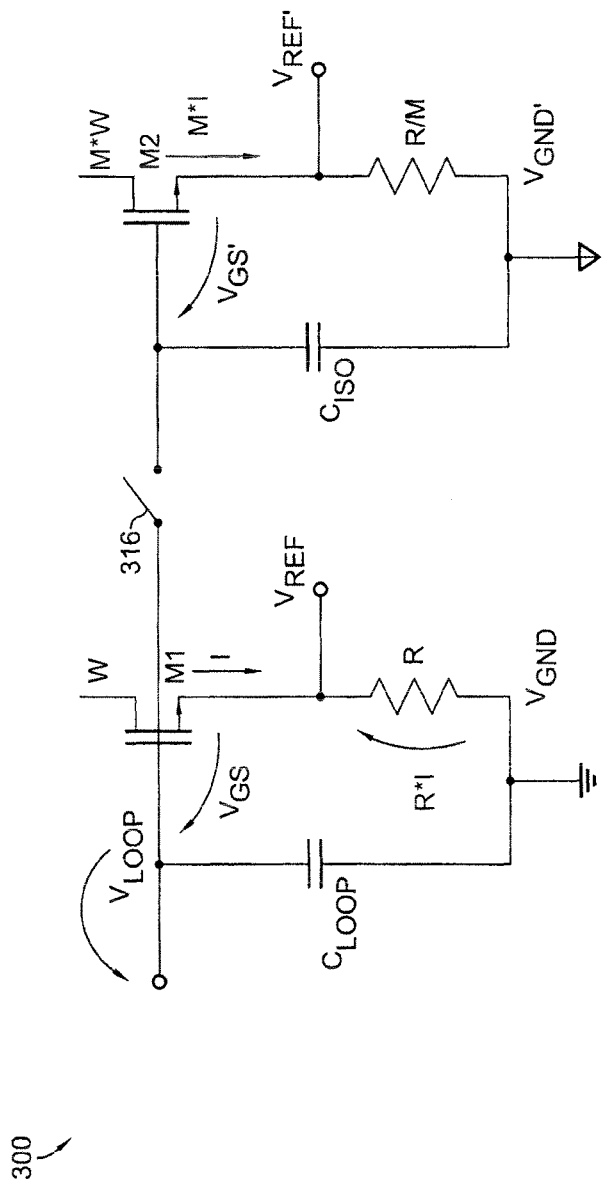
FIG. 3 is a schematic diagram of a portion of the second reference circuit shown in FIG. 2.
Figure 4:
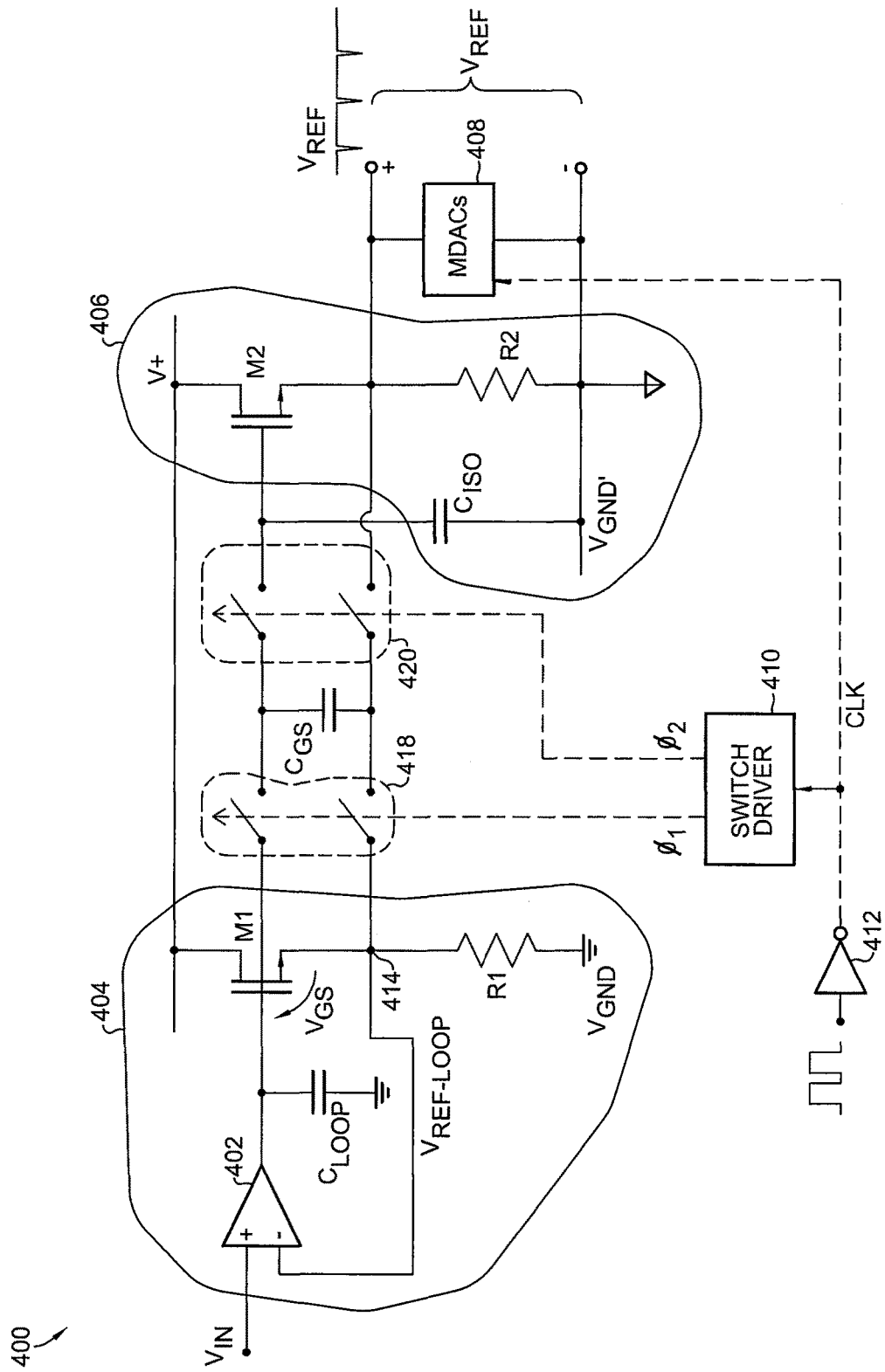
FIG. 4 is a schematic diagram of an embodiment of the reference circuit according to the present invention.

Referring now to FIG. 4, a reference circuit 400 according to the present invention is shown having an amplifier 402 having a positive input for receiving a $V_{IN}$ input signal, a negative input, and an output. A compensation capacitor $C_{LOOP}$ is coupled to the output of amplifier 402. The output of amplifier 402 is also coupled to the gate of transistor M1. The drain of transistor M1 is coupled to the power supply voltage V⁺. The source of transistor M1, node 414, is coupled to a first end of resistor R1 and to the negative input of amplifier 402, which is the $V_{REF\_LOOP}$ node. Amplifier 402 and resistor R1 are referenced to the $V_{GND}$ ground connection. Amplifier 402, the compensation capacitor $C_{LOOP}$, transistor M1 and resistor R1 form a linear regulator 404, for providing the $V_{REF\_LOOP}$ reference voltage. The gate-to-source voltage provided by the linear regulator 404 is coupled to the input of a first set of switches 418. Switches 418 are controlled by a first phase $\varphi_1$ clock signal provided by switch driver 410. The output of the first set of switches 481 is coupled to a $C_{GS}$ capacitor. In turn, the $C_{GS}$ capacitor is coupled to the input of a second set of switches 420. Switches 420 are controlled by a second phase $\varphi_2$ clock signal also provided by switch driver 410. The first set of switches 418, capacitor $C_{GS}$, and the second set of switches 420 form a "flying capacitor" circuit. The first and second clock phases $\varphi_1$ and $\varphi_2$ are provided by the switch driver 410. A common clock signal is coupled to the input of inverter/buffer 412, which in turn generates the CLK clock signal to switch driver 410, and is also provided to the MDAC circuitry 408. The output of the second set of switches 420 is coupled across the gate and source of transistor M2. The drain of transistor M2 is coupled to the V⁺ supply voltage. The source of transistor M2 is coupled to resistor R2 in driver stage 406. The gate of transistor M2 is coupled to an optional isolation capacitor $C_{ISO}$. Resistor R2 and the isolation capacitor $C_{ISO}$ are referenced to a second ground voltage $V_{GND'}$. The voltage across resistor R2 ($V_{REF}$) is used to drive the MDAC circuitry 408. Transistor M2, capacitor $C_{ISO}$, and resistor R2 form a buffer circuit, also referred to as a replica driver.

The phases $\Phi_1$ and $\Phi_2$ are substantially complementary, but non-overlapped and offset. The refresh capacitor $C_{GS}$ is isolated from the replicated driver during the occurrence of a pulse from the MDACs. At this critical time the refresh capacitor $C_{GS}$ is instead connected to the precision loop to record the $V_{GS}$ synthesized by the loop and copy the desired $V_{REF\_LOOP}$ at the replica driver output. It is important to note, therefore, that no path exists between the replica and the replicated circuits at this critical time, similar to what occurs in prior art. However, even after the occurrence of the MDAC spikes of current, when the capacitor $C_{GS}$ is connected to the driver of $V_{ref}$, no ohmic path connects the two circuits, unlike in any prior art, due to the non-overlap of the clock phases. As a result, the precision loop is protected from any $V_{GND}'$ spurious injections into it, which would instead occur in prior art during the "quiet" phase. Moreover as described before, when the active device and the resistors of the loop and of the replica driver do match, the generated $V_{GS}$ is exactly copied from transistor M1 onto transistor M2. This forces the same (or, scaled) current that flows into transistor M1 to flow into transistor M2. In turn, this forces the same R*I ohmic drop across resistor R2, independent of $V_{GND}'$ disturbances. Any such disturbances are simply superimposed to the differential voltage R*I+$V_{GS}$ on the gate of the transistor M2, which is floating at this time, and affect neither the charge of capacitor $C_{ISO}$ nor of $C_{GS}$, which are isolated through the gate impedance and the action of the first and second set of switches.

Figure 5:
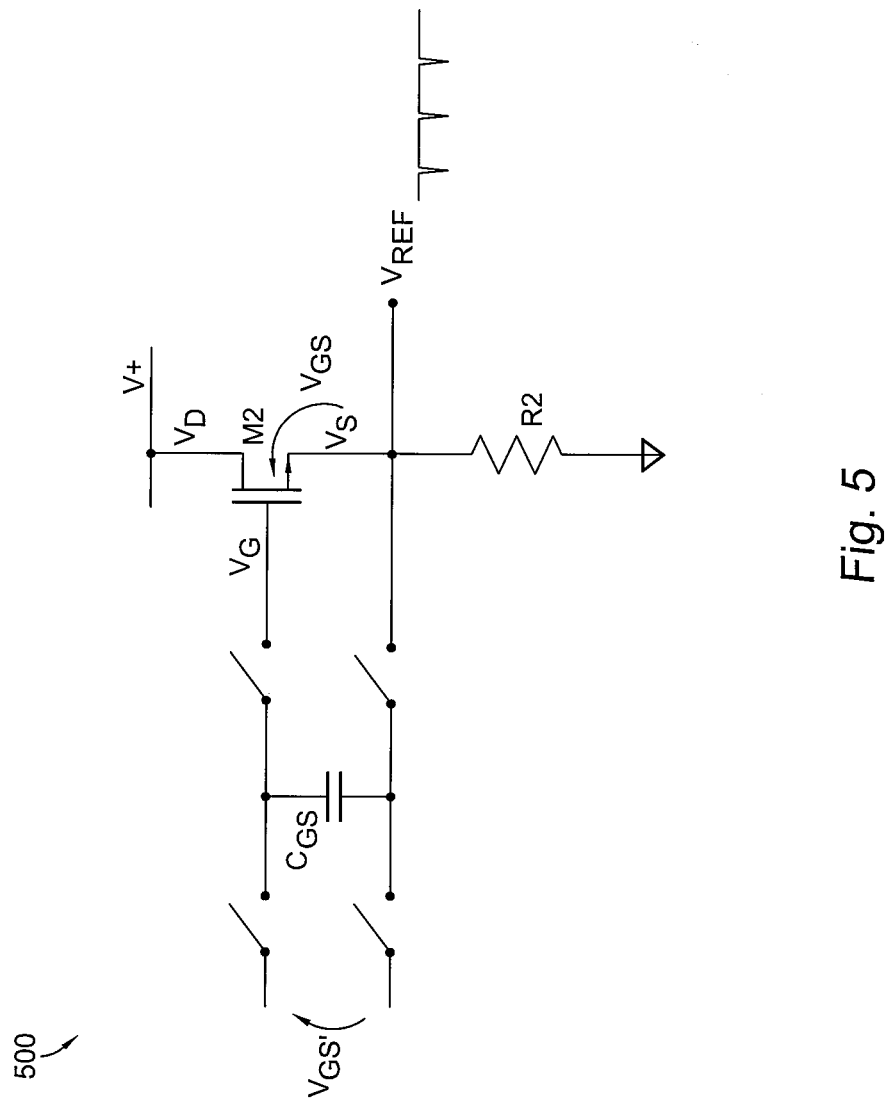
FIG. 5 is a schematic diagram of a portion of the reference circuit shown in FIG. 4.

An application of the present invention whereby the optional capacitor $C_{ISO}$ is removed still leads to a working circuit. In such embodiment, capacitor $C_{GS}$ would have to be connected across transistor M2 as shown in the circuit portion 500 of FIG. 5. The capacitor $C_{GS}$ is refreshed by the loop circuit during "pulse" occurrence instants, and coupled across the gate and source of M2 during "quiet" instants. This forces $V_{GS}'=V_{GS}$ at any time, but has the drawback of preventing the source follower from leveraging the quadratic dependence of $I_D$ on $V_{GS}$ typical of a MOSFET in saturation. Therefore the maximum driver current furnished to the MDACs is limited by $I_D(V_{GS})$ and thus the time needed to drive the MDAC, which defines the spike's duration, could be longer than in prior art. This effect could be tolerated in a slower circuit, and is partially mitigated by the increase in $V_{DS}$ of the device, which counters the $V_{DS}$ compression phenomenon that has been mentioned as a possible source of replica errors in the most recent prior art. In fact $V_S$ is pulled down by the MDAC, with $V_G$ simply following it and $V_D$ remaining tied to the supply $V_+$. The circuit shown in FIG. 5 is otherwise also effective at negating any $V_{GND}'$ impact on the loop, and maintaining isolation of the loop and replica driver at any time.

The differential nature of the charge injection through the switches driving $C_{GS}$ is another advantage over prior art. The additional noise contribution of kT/C nature can easily be minimized by increasing $C_{GS}$, possibly to the expense of $C_{ISO}$, given the increased degree of isolation from $V_{GND}'$ disturbances inherently provided by the invention. Also, it is important to notice that no switch has to be inserted on critical nodes such as supply or ground, with the corresponding undesirable necessity to make such switches large. The purpose of the switches in the present invention is only to convey control signals to internal nodes. An increase in capacitor $C_{GS}$ size versus $C_{ISO}$ size will help establishing a final equilibrium of $V_{GS}'=V_{GS}$ more quickly. However, this sort of dynamics in a system of this kind is usually dominated by the time constant of the precision loop $T_{LOOP}$, since often $T_{LOOP}$ is as large or greater than 1 ms for noise (and isolation) reasons. Such time constant is easily anticipated by the refresh time constant of the replica driver circuit. The differential nature of the circuit of the present invention is also what makes the reference voltage substantially radiation-tolerant. A ionizing particle hitting anywhere in the vicinity of the "flying capacitor" circuit will typically raise or lower the two lines associated with the switches replicating the original $V_{GS}$ voltage by the same amount, and the circuit performance will generally be substantially unaffected. This is explained in further detail below.

Referring to FIG. 6, a timing diagram is shown illustrating a typical set of perturbing pulses occurring on the $V_{REF}$ node caused by the MDAC circuitry, the switching signal for the first set of switches $\Phi_1$ and the switching signal for the second set of switches $\Phi_2$. Note that while the first and second switching signals are substantially complementary, they are non-overlapping and offset one from another.

The circuit of FIG. 4 has been simulated and the results, expressed in peak-to-peak voltages, are set forth below with respect to TABLES I, II, and III:

TABLE I

| VGND' | VREF_LOOP1 | VREF_LOOP2 | VREF_LOOP (PI) |
|---|---|---|---|
| 20 mV | 9.58 mV | 2.73 mV | 115 μV |

TABLE II

| VGND' | VREF1 | VREF2 | VREF (PI) |
|---|---|---|---|
| 20 mV | 11.69 mV | 3.31 mV | 1.03 mV |

TABLE III

| MDAC Modulation | VREF_LOOP1 | VREF_LOOP2 | VREF_LOOP (PI) |
|---|---|---|---|
| 10 mA max. pulses | 2.3 LSB | Less than 3% of LSB | Less than 3% of LSB |

The evidence presented in TABLE I represents the advantage afforded by the invention in case of ground bounce present on the MDAC ground, and more in general of any DC or AC difference found between the precision loop ground and the rest of the ADC. In simulation, a sinusoid with 10 mV amplitude and 1 MHz period has been superimposed on the ADC ground, while a pulse train running at the ADC sample rate of 80 MSps and modulated by a 10 MHz sinusoidal signal is coupled to the reference circuit to mimic the action of a conversion MDAC. While the most dramatic modulation of the ground rail happens synchronously with the charge glitch imposed by the MDAC, the time constant of the ground rail can lead to much slower tails engendered by such pulses, possibly with a transient ringing associated to the inductance of grounding bond wires. Internal ohmic drops due to the large amounts of DC and AC current conveyed through the ground rail can cause voltage differences of 50 to 100 mV even for carefully laid out metal paths.

With respect to the second column of TABLE I, the modulation induced by the ground signal on the internal node $V_{REF\_LOOP}$ of the precision loop driving the replica driver and the reference driver itself, is for an implementation similar to the first prior art solution. Due to the direct coupling of the loop with the driver, the ground modulation is copied onto the reference node almost entirely, yielding a peak-to-peak modulation of ~9.6 mV.

With respect to the third column of TABLE I, the effect of the same ground modulation on a circuit adopting the second prior art solution is shown. The effect of the bounce has been mitigated by separation of the grounds and by the periodic decoupling of the replica driver from the precision loop. However, since in the prior art there never is a complete decoupling of the two circuits with respect to time, and with at least one time instant when the driver is coupled to the loop, the modulation is still sizable at ~2.7 mV peak-to-peak.

Finally, the fourth column of TABLE I depicts the residual modulation found in the internal loop node when the circuit of the present invention is used. As expected, the complete decoupling of the driver from the slow precision loop leads to an almost complete cancellation of the bounce effect, which is now visible only with ~115 μV peak-to-peak magnitude. Since the driving voltage is imparted directly on the active device of the driver, its own gate (or driving electrode more in general) will track the ground modulation in order to force the desired $V_{ref}$ across the degeneration resistor (or degeneration load more in general). The "flying capacitor" circuit used to couple the two circuits, due to the non-overlapped nature of the clock controlling the coupling instants, isolates the loop by a factor of 27.5 dB as compared to second prior art solution, and up to 38.4 dB as compared to first prior art solution.

Besides providing evidence of the precision loop not being perturbed, it is vital to prove the resiliency of the final synthesized reference voltage $V_{REF}$ (the desired output of the circuit block) against the ground bounce. Therefore the same simulations that yielded the results shown in TABLE I have been used to probe the $V_{REF}-V_{GND}'$ differential voltage in the same three cases, to yield the results shown in TABLE II.

The second column of TABLE II proves that the modulation noticed on the regulated node of the loop does not merely cancel out the ground bounce across the driver. In fact, the different attenuation between the paths coupling the ground to the two nodes leaves some ~11.7 mV peak-to-peak sinusoidal signal at the output of the circuit, which will in turn affect the whole operation of the ADC and cause a very sizable distortion tone in the converted signal spectrum.

The third column of TABLE II also confirms that the second prior art solution is sensitive to this sort of ground disturbance. The driving node was impacted by it, and since the loop stabilized the output voltage with respect to its own quiet ground $V_{GND}$ and not with respect to $V_{GND'}$, the differential voltage at the driver's output is affected by ~3.3 mV residual modulation.

The fourth column of TABLE II proves that the invention not only stabilized the voltage inside the loop, but is able to reject the ground bounce to a larger extent. The stable voltage imparted to the gate and to the $V_{GS}$ of the active device forces a stable current inside the degeneration resistor, which adds its own voltage drop on the ground bounce to ultimately modulate the Vgate and Vsource voltages—not the reference output voltage. The residual ~1 mV observed in TABLE II is to be ascribed to the second-order $V_{DS}$ modulation experienced by the active device, an effect that will diminish with higher supply voltages or lower reference output voltages, and whose mitigation is beyond the scope of the solution of the present invention.

The evidence presented above is relative to the advantage afforded by the invention over prior art in presence of ground bounce. The final piece of evidence to be provided concerns the efficacy of the invention at quenching the rectification and otherwise the modulation effects over the reference stabilized voltage, in presence of charge glitches forced by the MDAC (or equivalent ADC block) in correspondence to an input signal. In this respect, the increased degree of isolation guaranteed by the double set of two switches on the flying capacitor will provide only an incremental, small advantage over prior art, where the disconnection of precision loop and replica driver was also claimed. However, in the second prior art solution, a disconnection operated in correspondence of a major glitch was claimed; in standard implementations of pipeline ADCs for example, every half-clock cycle a set of stages is exercising the voltage reference driver, and therefore some perturbation coming from time-interleaved stages would still affect the driver. In the implementation of the present invention, during such phase the flying capacitor would register the glitch, but not be impacted by it at all if the transient is exhausted by the end of the half-cycle. In the first prior art solution the direct coupling of all glitches would be captured inside the loop and cause long-term drift or modulation. In the second prior art solution the direct coupling of some of the glitches would cause a smaller residual effect.

Notice that the second prior art solution could be made more rugged against glitches by opening the isolation switch during all occurrences of glitches, yet at a considerable cost of clock complexity and increased difficulty of synchronization. In the embodiment of the present invention, the loop never sees directly any perturbation coming from the MDACs. Although it is preferable to leave even the flying capacitor disconnected from the loop during the major glitch occurrence, even the occurrence of smaller glitches can be completely isolated from the loop on a natural two-phase clock basis, without resorting to complicated clock phase timing, and alignment with the operation of the rest of the converter.

The second column of TABLE III demonstrates the inadequacy of the first prior art solution at countering this modulation effect. The train of charge pulses being modulated slowly enough to be registered inside the closed-loop bandwidth of the precision feedback circuit, causes a slow modulation of the whole envelope of the reference voltage (i.e. the "correction" response generated by the loop) of about 86 μV peak-to-peak, which in the paradigm of a 16 bit ADC resolution with 2.75 V signal amplitude results in ~2.3 LSB distortion. This spurious effect is enough to prevent a 100 dBc SFDR ("Spurious-Free Dynamic Range") performance specification from being achieved.

The third column of TABLE III confirms that the second prior art solution eliminates this sort of signal-dependent modulation, since the envelope of the output voltage is now moving by less than 1 μV, or <3% of an LSB, close to the absolute precision of the simulation being carried out.

Finally, the fourth column of TABLE III proves that, besides being vastly superior in terms of ground bounce rejection, the circuit of the present invention is not any inferior to the second prior art solution with respect to glitch-induced transients, since it limits the spurious modulation to <1 μV as well.

It is of fundamental importance to notice that, unlike the most recent prior art, the proposed invention is inherently radiation-tolerant. In fact, the fully-differential arrangement of the switches coupling the flying capacitor to the precision loop (during one phase) and to the replica driver (during the complementary non-overlapped phase) allows to transform a single-particle hit event from differential to common-mode, when the geometry of the switches is planned to maximize the probability of the "hit path" affecting both devices. In the prior art, during at least one, or even in both clock phases, a single switch coupling the loop to the holding capacitor can be found. In previous implementations, in a single-event particle hit this circumstance translates into a net charge injection affecting the isolation capacitor, which not only impacts the correctness of the data conversion within the clock cycle of occurrence of the particle hit, but may require a conspicuous amount of time for the capacitors to be brought back to the desired bias by the slow loop. In fact, from a purely electrical standpoint it is immediate to see that another drawback of prior art is the single-ended clock-feedthrough charge injection imparted by the switches over the isolation capacitor. A paired arrangement of the switches such as the one of the invention can mitigate such non-ideality, which calls otherwise for the usage of small coupling switches in order to mitigate this drawback, which in turn slows down the recovery time of the reference circuit apparatus.

The adoption of a differential switch configuration not only allows to minimizing the clock feedthrough charge injected at each clock edge, but especially minimizes the charge contributed to the capacitors (both flying, and isolation cap) during a single-particle hit event. In the case of usage of a single switch, the adoption of a generally smaller flying capacitor could otherwise exacerbate the injection effect, as the same amount of charge would deposit on a smaller capacitance. Proper relative sizing of both switches could take into account the fact that they are operated at different bias voltages (a voltage $V_{GS}$ apart from each other), and be determined mathematically or by simulation. General practice in the art however suggests equal sizing for both switches to roughly equalize the Coverlap*Vclock injections, at least to a first order.

The additional kT/C noise contributed by the switching of the flying capacitor is usually swamped by the noise contributions of the numerous active devices of the ADC, and the RMS-summation nature of the noise prevents this addendum from becoming a limiting factor. Careful sizing of the flying capacitor is a recommended precaution towards adoption of the invention in a high-resolution converter architecture.

Although an embodiment of the present invention has been described for purposes of illustration, it should be understood that various changes, modification and substitutions may be incorporated in the embodiment and method of the present invention without departing from the spirit of the invention that is defined in the claims, which follow.

We claim:

1. A reference circuit comprising:
   a voltage reference circuit for generating a current-controlling voltage at first and second terminals, wherein the current-controlling voltage comprises a gate-to-source voltage of a transistor in the voltage reference circuit;
   a driver circuit for receiving the current-controlling voltage at first and second terminals and for generating a single-ended reference voltage, wherein the driver circuit comprises a transistor that receives the current-controlling voltage across a gate and a source of said transistor; and
   a differential voltage sampling circuit having first and second input terminals coupled to the first and second terminals of the voltage reference circuit, and first and second output terminals coupled to the first and second terminals of the driver circuit, wherein the first and second input terminals are selectively completely isolated from the voltage reference circuit by an open circuit, and wherein the first and second output terminals are selectively completely isolated from the driver circuit by an open circuit, such that the voltage reference circuit and the driver circuit are continuously isolated from each other by an open circuit,
   wherein the first and second terminals of the voltage reference circuit are distinct from a first ground node associated with the voltage reference circuit, and wherein the first and second terminals of the driver circuit are distinct from a second ground node associated with the driver circuit.

2. The reference circuit of claim 1 wherein the voltage reference circuit comprises:
   an amplifier having a first input for receiving an input voltage, a second input, and an output;
   the transistor whose gate-to-source voltage supplies the current-controlling voltage, wherein the transistor has a control electrode coupled to the output of the amplifier, and a current path; and
   a resistive element coupled to the current path of the transistor and to the second input of the amplifier.

3. The reference circuit of claim 1 wherein the voltage reference circuit further comprises a compensation capacitor.

4. The reference circuit of claim 1 wherein the differential voltage sampling circuit comprises:
   a first pair of switches coupled to the first and second input terminals;
   a second pair of switches coupled to the first and second output terminals; and
   an energy storage element coupled between the first and second pair of switches.

5. The reference circuit of claim 4 wherein the energy storage element comprises a capacitor.

6. The reference circuit of claim 4 wherein the first pair of switches is controlled by a first clock signal, and the second pair of switches is controlled by a second clock signal.

7. The reference circuit of claim 6 wherein the first clock signal and the second clock signal are generated from a common clock signal.

8. The reference circuit of claim 6 wherein the first and second clock signals are non-overlapping.

9. The reference circuit of claim 1 wherein the driver circuit comprises the transistor that receives the current-controlling voltage across its gate and source, wherein the transistor has a control electrode coupled to the first output terminal of the differential voltage sampling circuit, and a resistive element coupled to a current path of the transistor and to the second output terminal of the differential voltage sampling circuit.

10. The reference circuit of claim 1 wherein the driver circuit further comprises an isolation capacitor.

11. The reference circuit of claim 1 wherein the voltage reference circuit is referenced to a first ground potential and the driver circuit is referenced to a second ground potential.

12. The reference circuit of claim 1 wherein the voltage reference circuit comprises a substantially radiation-tolerant reference circuit.

13. A reference circuit comprising:
   a voltage reference circuit referenced to a first ground potential for generating a differential control voltage between nodes distinct from the first ground potential, wherein the nodes comprise a gate and a source of a transistor in the voltage reference circuit;
   an output circuit referenced to a second ground potential for receiving the differential control voltage between nodes distinct from the second ground potential and for generating a single-ended reference voltage coupled to a load, wherein the nodes of the output circuit comprise a gate and a source of a transistor in the output circuit; and
   a differential sampling circuit for transferring the differential control voltage from the voltage reference circuit to the output circuit such that the voltage reference circuit is substantially isolated from any AC perturbation or DC drift associated with the load, wherein the differential sampling circuit continuously completely isolates the voltage reference circuit from the driver circuit by open circuits.

14. The reference circuit of claim 13 wherein the voltage reference circuit comprises:
an amplifier having a first input for receiving an input voltage, a second input, and an output;
the transistor whose gate and source supply the differential control voltage, wherein the gate of the transistor is coupled to the output of the amplifier, a drain of the transistor receives a supply voltage, and the source is coupled to the second input of the amplifier; and
a resistive element coupled between the source of the transistor and the first ground potential.

15. The reference circuit of claim 13 wherein the differential sampling circuit comprises:
a pair of input switches;
a pair of output switches; and
an energy storage element coupled between the two pairs of switches.

16. The reference circuit of claim 15 wherein the energy storage element comprises a capacitor.

17. The reference circuit of claim 13 wherein the output circuit comprises:
the transistor whose gate and source receive the differential control voltage supplied by the voltage reference circuit, wherein the transistor has a drain for receiving a supply voltage; and
a resistive element coupled between the source of the transistor and the second ground potential.

18. The reference circuit of claim 13 wherein the differential sampling circuit is controlled by first and second clock signals.

19. The reference circuit of claim 18 wherein the first and second clock signals are non-overlapping.

20. The reference circuit of claim 13 wherein the load comprises an analog-to-digital converter and a common clock signal is operatively coupled to the differential voltage sampling circuit and the load.

21. A reference circuit comprising:
an input circuit for providing a differential control signal responsive to an input signal between nodes distinct from a first ground node of the input circuit, wherein the nodes comprise a gate and a source of a transistor in the input circuit;
an output circuit for receiving the differential control signal between nodes distinct from a second ground node of the output circuit and providing a single-ended reference voltage in response thereto, wherein the nodes of the output circuit comprise a gate and a source of a transistor in the output circuit; and
a differential coupling circuit for transferring the differential control signal from the input circuit to the output circuit such that the input circuit is always isolated from the output circuit, wherein the differential coupling circuit continuously completely isolates the input circuit from the output circuit by open circuits.

22. The reference circuit of claim 21 wherein the differential coupling circuit comprises a flying capacitor circuit.

23. The reference circuit of claim 21 wherein the reference circuit comprises a substantially radiation-tolerant reference circuit.

\* \* \* \* \*